United States Patent
Halliyal et al.

(10) Patent No.: US 6,949,481 B1
(45) Date of Patent: Sep. 27, 2005

(54) PROCESS FOR FABRICATION OF SPACER LAYER WITH REDUCED HYDROGEN CONTENT IN SEMICONDUCTOR DEVICE

(75) Inventors: Arvind Halliyal, Cupertino, CA (US); Fred T K Cheung, San Jose, CA (US); Rinji Sugino, San Jose, CA (US); Hidehiko Shiraiwa, San Jose, CA (US); Tazrien Kamal, San Jose, CA (US); Jean Y. Yang, Sunnyvale, CA (US)

(73) Assignee: FASL, LLC, Sunnyvale, CA (US)

( * ) Notice: Subject to any disclaimer, the term of this patent is extended or adjusted under 35 U.S.C. 154(b) by 44 days.

(21) Appl. No.: 10/731,494

(22) Filed: Dec. 9, 2003

(51) Int. Cl.[7] .............................................. H01L 21/31
(52) U.S. Cl. ...................................................... 438/795
(58) Field of Search ................................ 438/761, 795

(56) References Cited

U.S. PATENT DOCUMENTS

| | | | |
|---|---|---|---|
| 5,087,589 A * | 2/1992 | Chapman et al. ............ | 438/467 |
| 5,284,549 A | 2/1994 | Barnes et al. ................ | 156/662 |
| 5,648,113 A | 7/1997 | Barbee et al. ................ | 427/8 |
| 5,707,901 A | 1/1998 | Cho et al. .................... | 438/595 |
| 5,840,600 A | 11/1998 | Yamazaki et al. ............ | 438/51 |
| 5,872,387 A | 2/1999 | Lyding et al. ................ | 257/607 |
| 5,970,384 A | 10/1999 | Yamazaki et al. ........... | 438/795 |
| 6,022,799 A | 2/2000 | Foote et al. ................. | 438/637 |
| 6,037,003 A | 3/2000 | Gordon et al. ........... | 427/255.34 |
| 6,180,190 B1 | 1/2001 | Gordon ....................... | 427/565 |
| 6,190,966 B1 | 2/2001 | Ngo et al. ................... | 438/257 |
| 6,194,784 B1 | 2/2001 | Parat et al. .................. | 257/774 |
| 6,306,777 B1 | 10/2001 | Ogle, Jr. et al. ............ | 438/763 |
| 6,319,775 B1 | 11/2001 | Halliyal et al. ............. | 438/261 |
| 6,319,809 B1 | 11/2001 | Chang et al. ............... | 438/597 |
| 6,468,599 B1 | 10/2002 | Terada ......................... | 427/558 |
| 6,479,379 B2 | 11/2002 | Reinberg .................... | 438/635 |
| 6,765,259 B2 * | 7/2004 | Kim ............................ | 257/315 |
| 6,767,796 B2 * | 7/2004 | Tanaka et al. .............. | 438/299 |
| 6,803,265 B1 * | 10/2004 | Ngo et al. ................... | 438/188 |
| 2002/0068229 A1 | 6/2002 | Westerman et al. ............ | 430/5 |
| 2003/0067030 A1 * | 4/2003 | Torii .......................... | 257/315 |

OTHER PUBLICATIONS

U.S. Appl. No. 10/731,659, filed Dec. 9, 2003, entitled "Process for Fabrication of Nitride Layer with Reduced Hydrogen Content in Ono Structure in Semiconductor Device."

* cited by examiner

Primary Examiner—W. David Coleman
(74) Attorney, Agent, or Firm—Renner, Otto, Boisselle & Sklar, LLP

(57) ABSTRACT

Process for fabricating a semiconductor device including steps of providing a semiconductor substrate having formed thereon a semiconductor device; depositing over the semiconductor device a spacer layer, the spacer layer having a first hydrogen content; and applying a treatment to reduce the first hydrogen content to a second hydrogen content. The invention is particularly useful when applied to flash memory devices such as a charge trapping dielectric flash memory device.

20 Claims, 5 Drawing Sheets

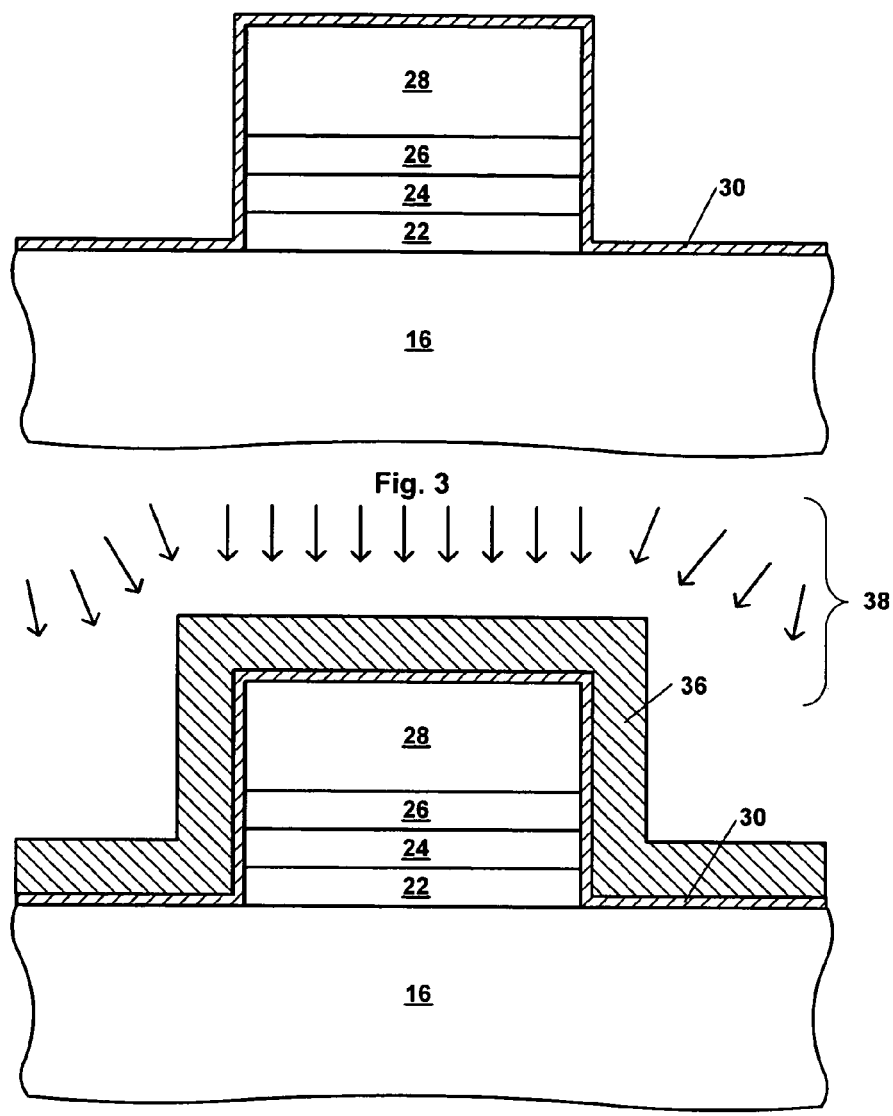
Fig. 3
Fig. 4
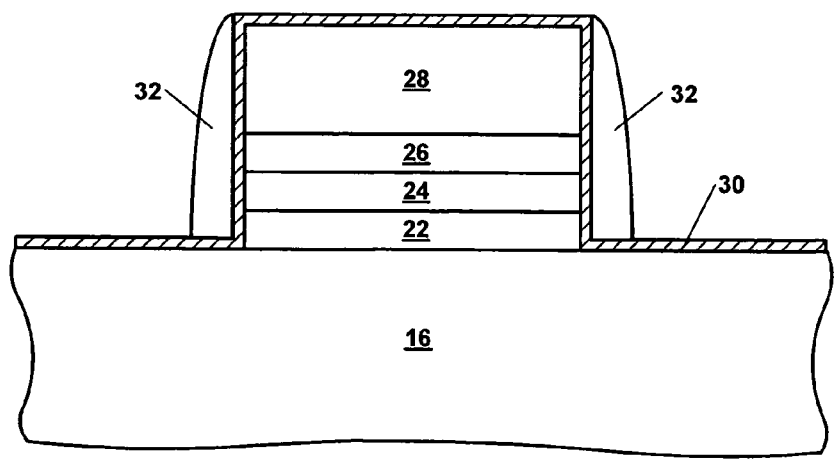
Fig. 5

PROCESS FOR FABRICATION OF SPACER LAYER WITH REDUCED HYDROGEN CONTENT IN SEMICONDUCTOR DEVICE

TECHNICAL FIELD

The present invention relates to semiconductor devices and the fabrication thereof and, more particularly, to a charge trapping dielectric flash memory device with reduced hydrogen content in gate stack spacer material and a method of formation of the gate stack spacer with reduced hydrogen content.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important charge storage material for EEPROM devices is a charge trapping dielectric, for example silicon nitride in an oxide-nitride-oxide (ONO) structure. One EEPROM device that utilizes a charge trapping dielectric charge storage layer is a silicon-oxide-nitride-oxide-silicon (SONOS) type flash memory cell. In other such devices, like SONOS, the charge storage is in a charge trapping dielectric layer, but the materials of the various layers may vary from those used in SONOS devices. That is, the silicon, oxide or nitride may be replaced with another material. For example, silicon may be replaced by germanium or silicon-germanium, oxide and/or nitride may be replaced by, e.g., a high-K dielectric material. Such devices, as well as the SONOS device, are generally included within the designation "charge trapping dielectric flash memory" device, as used herein.

In charge trapping dielectric flash memory devices, during programming, electrical charge is transferred from the substrate to the charge trapping dielectric charge storage layer, e.g., the nitride (N) layer in an ONO structure. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the charge trapping dielectric layer. This jump is known as hot carrier injection (HCI), the hot carriers being electrons. Electrons are trapped near the drain region because the electric fields are the strongest near the drain. Reversing the potentials applied to the source and drain will cause electrons to travel along the channel in the opposite direction and be injected into the charge trapping dielectric layer near the source region. Because the charge trapping dielectric material is not electrically conductive, the charge introduced into the charge trapping dielectric layer tends to remain localized. Accordingly, depending upon the application of voltage potentials, electrical charge can be stored in discrete regions within a single continuous charge trapping dielectric charge storage layer.

Non-volatile memory designers have taken advantage of the localized nature of electron storage within a charge trapping dielectric layer and have designed memory circuits that utilize two or more regions of stored charge within the layer. This type of non-volatile memory device is known as a dual-bit or multi-bit EEPROM, or as a charge trapping dielectric flash memory device. Such a device is available under the trademark MIRRORBIT™ from Advanced Micro Devices, Inc., Sunnyvale, Calif. The MIRRORBIT™ device is capable of storing twice as much information as a conventional EEPROM in a memory array of equal size. A left bit and a right bit are stored in physically different areas of the charge trapping dielectric layer, near the left and right regions of each memory cell. The above-described programming methods are used to enable the two bits to be programmed and read independently. The two bits of the memory cell can be individually erased by applying suitable erase voltages to the gate and to either the source or drain regions.

While the recent advances in charge trapping dielectric flash memory technology have enabled memory designers to double the memory capacity of charge trapping dielectric flash memory arrays using dual-bit data storage, numerous challenges remain in the fabrication of material layers within these devices.

In a charge trapping dielectric flash memory cell, the control gate electrode is separated from the charge trapping dielectric charge storage layer by a top dielectric layer (usually an oxide), and the charge storage layer is separated from the semiconductor substrate (channel region) by a bottom dielectric layer (usually an oxide), forming the oxide-charge trapping dielectric-oxide stack, e.g., the ONO structure. The control gate electrode is isolated from laterally surrounding structures by a gate stack spacer, which conventionally comprises a thin layer (e.g., about 100–300 angstroms) of silicon dioxide and a larger structure of silicon nitride. The conventional gate stack spacer is deposited by PECVD, but this method imparts a significant hydrogen content into the silicon nitride. For example, the conventionally employed PECVD method can impart substantially greater than about two atomic percent, e.g., up to as much as about 30 atomic percent, hydrogen into the silicon nitride of the gate stack spacer. Previously, the hydrogen content in the gate stack spacer has not presented a significant problem to proper functioning of devices such as charge trapping dielectric flash EEPROM memory devices. As noted above, as dimensions continue to be reduced, more variables must be considered in the design and fabrication of semiconductor devices.

Hydrogen content is a variable which may affect performance of semiconductor devices generally, and as exemplified herein, in charge trapping dielectric flash EEPROM memory devices, particularly in view of the continually-sought reduced dimensions of modern semiconductor devices. The present inventors have discovered that hydrogen contained in structures such as the gate stack spacer can migrate into the dielectric layers such as the oxide spacer layer and into the bottom or tunnel oxide layer, and/or into the top oxide layer, and can cause problems such as degradation of device properties. These problems may include adverse effects on the subthreshold slope or transconductance GM after program/erase as a result of the migration.

As device dimensions have steadily decreased, the effect of such hydrogen becomes more pronounced, as discovered by the present inventors.

Accordingly, advances in fabrication technology of structures such as the gate stack spacer structure mentioned above are needed to eliminate or reduce problems resulting from hydrogen in the gate stack spacer structure used in charge trapping dielectric flash memory devices. While the present invention is described particularly with respect to a particular embodiment, i.e., the charge trapping dielectric flash memory device, the invention is broadly applicable to any semiconductor device which is susceptible to adverse effects resulting from the presence of hydrogen in dielectric layers.

DISCLOSURE OF THE INVENTION

The present invention, in one embodiment, relates to a process for fabricating a semiconductor device including steps of providing a semiconductor substrate having formed thereon a semiconductor device; depositing over the semiconductor device a spacer layer, the spacer layer having a first hydrogen content; and applying a treatment to reduce the first hydrogen content to a second hydrogen content.

In another embodiment, the present invention relates to a process for fabricating a charge trapping dielectric flash memory device including providing a semiconductor substrate having formed thereon a gate stack including a charge trapping dielectric charge storage layer and a control gate electrode overlying the charge trapping dielectric charge storage layer; depositing over the gate stack a spacer layer, the spacer layer having a first hydrogen content; and applying a treatment to reduce the hydrogen content of the gate stack spacer to a second hydrogen content.

In another embodiment, the present invention relates to charge trapping dielectric flash memory device including a semiconductor substrate having formed thereon a gate stack comprising a charge trapping dielectric charge storage layer and a control gate electrode overlying the charge trapping dielectric charge storage layer; and a gate stack spacer adjacent the sides of the gate stack, in which the gate stack spacer comprises a hydrogen content less than about two atomic percent.

Thus, the present invention addresses the problem of hydrogen in dielectric materials of semiconductor devices such as gate stack spacers in charge trapping dielectric flash memory devices, in which the hydrogen may cause problems in operation of the semiconductor device resulting from its presence in the dielectric materials.

DESCRIPTION OF THE DRAWINGS

FIGS. 2–7 are schematic cross-sectional views of portions of a semiconductor substrate containing elements formed by steps in fabrication of the gate stack spacers, in accordance with two embodiments of the present invention.

Figure 1:
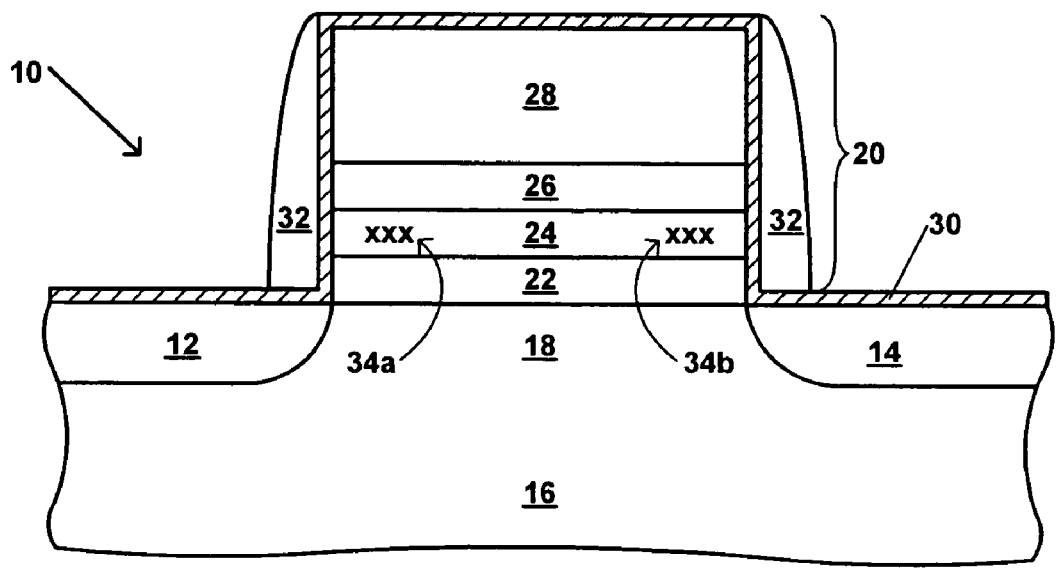
FIG. 1 is a schematic cross-sectional view of a portion of a semiconductor substrate containing a charge trapping dielectric flash memory device including gate stack spacers fabricated in accordance with an embodiment of the invention.

It should be appreciated that for simplicity and clarity of illustration, elements shown in the Figures have not necessarily been drawn to scale. For example, the dimensions of some of the elements may be exaggerated relative to each other for clarity. Further, where considered appropriate, reference numerals have been repeated among the Figures to indicate corresponding elements.

It should be appreciated that the process steps and structures described below do not form a complete process flow for manufacturing a semiconductor device such as a charge trapping dielectric flash memory device or other device. The present invention can be practiced in conjunction with fabrication techniques currently used in the art, and only so much of the commonly practiced process steps are included as are necessary for an understanding of the present invention.

DETAILED DESCRIPTION OF THE INVENTION

It should be appreciated that while the present invention will be described in terms of a charge trapping dielectric flash memory device, the present invention is not limited to such device, and is applicable to a broad range of semiconductor devices and their fabrication processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETs). While aspects of the present invention will now be described in more detail with reference to a charge trapping dielectric flash memory device, it will be understood that the invention is applicable to the above-mentioned and other semiconductor devices which are susceptible to problems resulting from the hydrogen content of elements of which the device is formed, where the elements are amenable to treatments such as disclosed herein.

Turning now to FIG. 1, there is schematically shown in cross-section a transistor 10 suitable for use in a charge trapping dielectric flash memory device, such as the MIRRORBIT™. The transistor 10 includes source/drain regions 12 and 14 located in a semiconductor substrate 16 and separated by a channel region 18. A gate stack 20 is formed over the channel region 18, and may extend over portions of the source region 12 and the drain region 14. The gate stack 20 may also be referred to as a stacked-gate or stack gate structure. The gate stack 20 includes a bottom oxide layer 22, a charge trapping dielectric charge storage layer 24 and a top oxide layer 26, as shown in FIG. 1. The gate stack 20 further includes a gate electrode 28 overlying the top oxide layer 26. The bottom oxide layer 22, the charge storage layer 24 and the top oxide layer 26 are sometimes referred to herein and in the art as an ONO structure. In conventional ONO structures, the "O" oxide layers are silicon dioxide, and the "N" charge storage layer is silicon nitride. In accordance with some embodiments of the present invention, the ONO structure may include in either or both "O" layers materials other than silicon dioxide, and "N" charge trapping dielectric charge storage materials other than silicon nitride, but the resulting structure will still be referred to herein as an ONO structure. For example, any one or more of the O layers or the N layer may comprise a high-K dielectric material, as described in more detail below. As schematically shown in FIG. 1, charges 34a and 34b may be stored in the charge storage layer 24, which acts as a charge or electron storage layer in the charge trapping dielectric flash memory device.

Referring still to FIG. 1, as shown therein, the gate stack 20 is covered by a thin oxide layer 30. The thin oxide layer 30 enhances isolation of the gate stack 20 and other elements of the device 10. The thin oxide layer 30 may have a thickness in the range from about 20 angstroms to about 300 angstroms, for example, and in one embodiment, about 100 angstroms. The thin oxide layer 30 may be formed or deposited by any conventionally known method for forming or depositing such a layer.

As shown in FIG. 1, gate stack spacers 32 are located on both sides of the gate stack 20. The gate stack spacers 32 alternatively may be referred to as isolation spacers or sidewall spacers. The gate stack spacers 32 comprise a reduced quantity or concentration of hydrogen, in accordance with the present invention. In accordance with the present invention, the gate stack spacers 32 are deposited by conventional methods and are thereafter treated to reduce the hydrogen content of the spacer, or the spacer layer from which the spacer will be formed by etching, from a first, as-formed hydrogen content to a second, lower hydrogen content, by applying a treatment described in more detail below, in accordance with the present invention. Thus, as used herein, "reduced hydrogen content" refers to the hydrogen content of a structure such as the spacer 32 for example following a treatment as disclosed herein, relative to the hydrogen content of a conventional, as-deposited structure of the same material.

Operation of the charge trapping dielectric flash memory device 10 shown in FIG. 1, is substantially the same as described in the background of the invention, except that reducing the hydrogen content in the gate stack spacers 32 facilitates continued smooth and problem free processing and operation of the device in use. In the operation of the exemplary charge trapping dielectric flash memory 10, voltages are applied to the gate electrode 28 and as appropriate to the source/drain regions 12 and 14. The applied voltages cause electrical charge, e.g., one of charges 34a or 34b, to propagate from the channel region 18 into the charge storage layer 24. The charges 34a, 34b are localized in regions of the charge storage layer 24 in proximity to either the source/drain region 12, or the source/drain region 14, as shown in FIG. 1.

Those skilled in the art will recognize that for proper functioning of a charge trapping dielectric flash memory device, the electrical charges 34a, 34b should remain localized and isolated in the regions of the charge storage layer 24 to which it is initially introduced. Furthermore, it has become apparent that hydrogen contamination of the bottom oxide layer 22 and/or the top oxide layer 26 can cause non-ideal capacitance voltage characteristics and channel conductance. The present inventors have discovered that hydrogen in the gate stack spacers 32 can migrate into adjacent structural elements, such as the bottom oxide layer 22 and/or the top oxide layer 26, during subsequent processing and/or during use of the device, and thereby result in such problems. In other types of semiconductor devices, any such excess hydrogen from dielectric material layers may migrate into adjacent structural elements and thereby cause similar problems due to its presence. Thus, hydrogen may present a problem in the function of the layer in which it is originally present, or in layers into which it may migrate during subsequent processing or during end use.

In accordance with the invention, the gate stack spacers 32, or as appropriate, a layer from which the gate stack spacers 32 will be formed, are deposited and are subsequently treated by methods which result in the reduction of the hydrogen content, relative to such structures formed by conventional methods and not so treated. The improved device performance obtained by the present invention can be better understood following a description of a fabrication process carried out in accordance with the invention.

Figure 6:
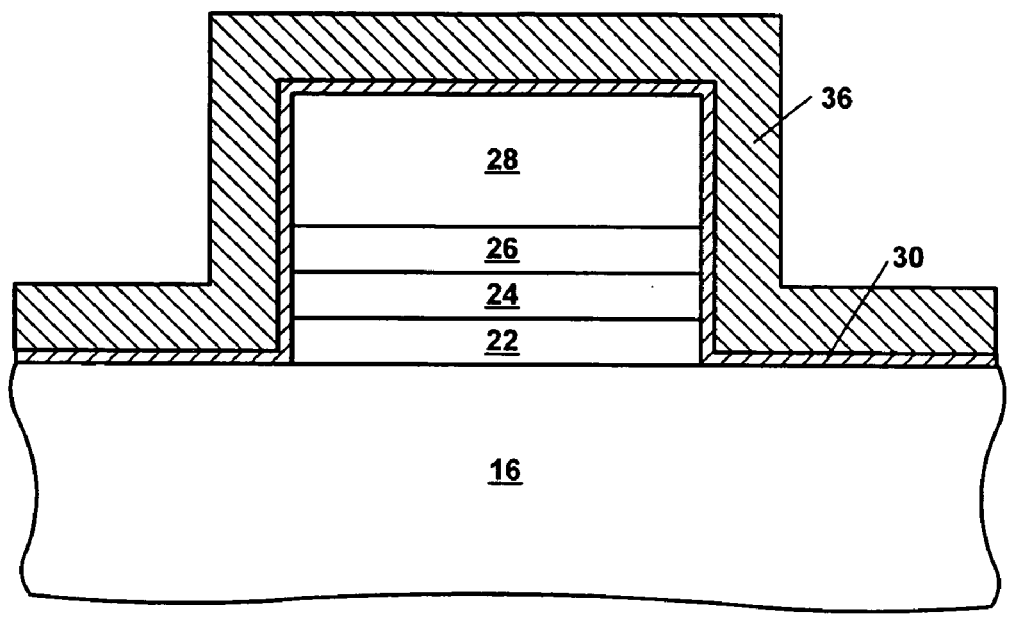
Figure 7:
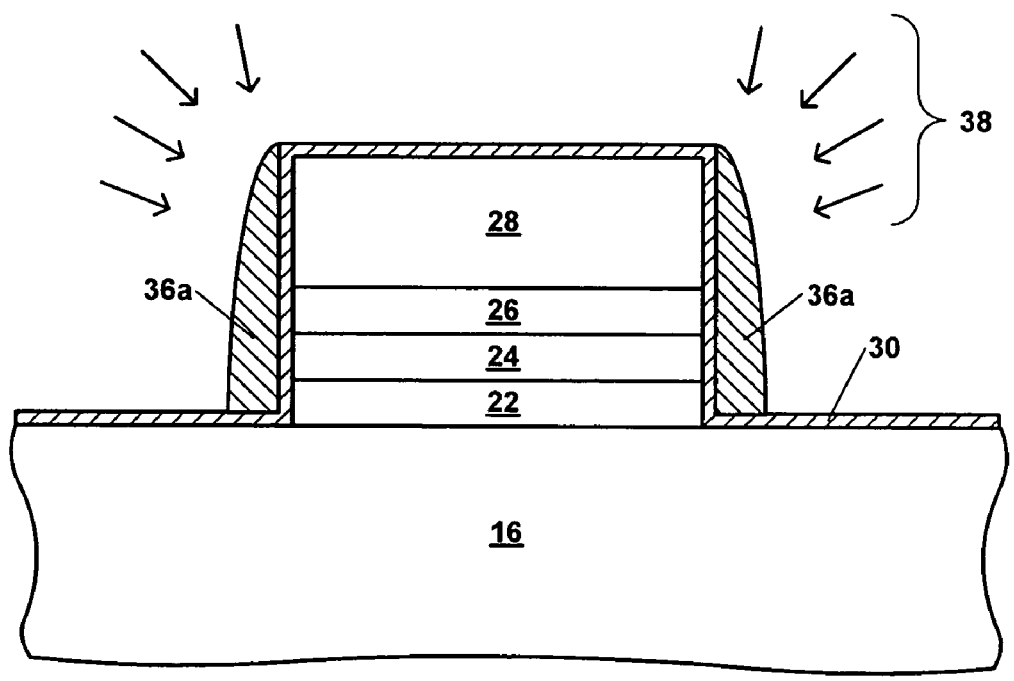
Figure 8:
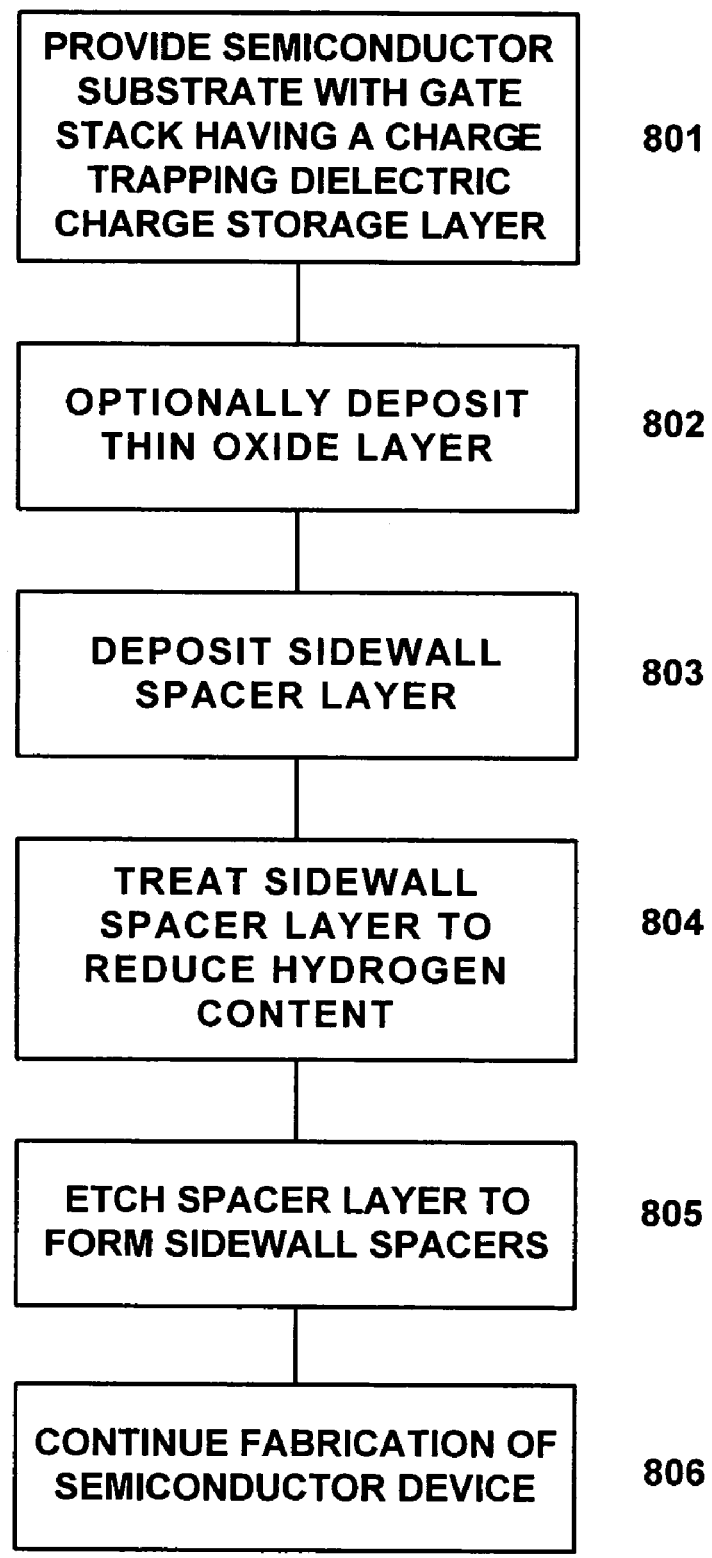
FIG. 8 is a schematic flow diagram generally illustrating steps of fabricating a device in accordance with an embodiment of the present invention.
Figure 9:
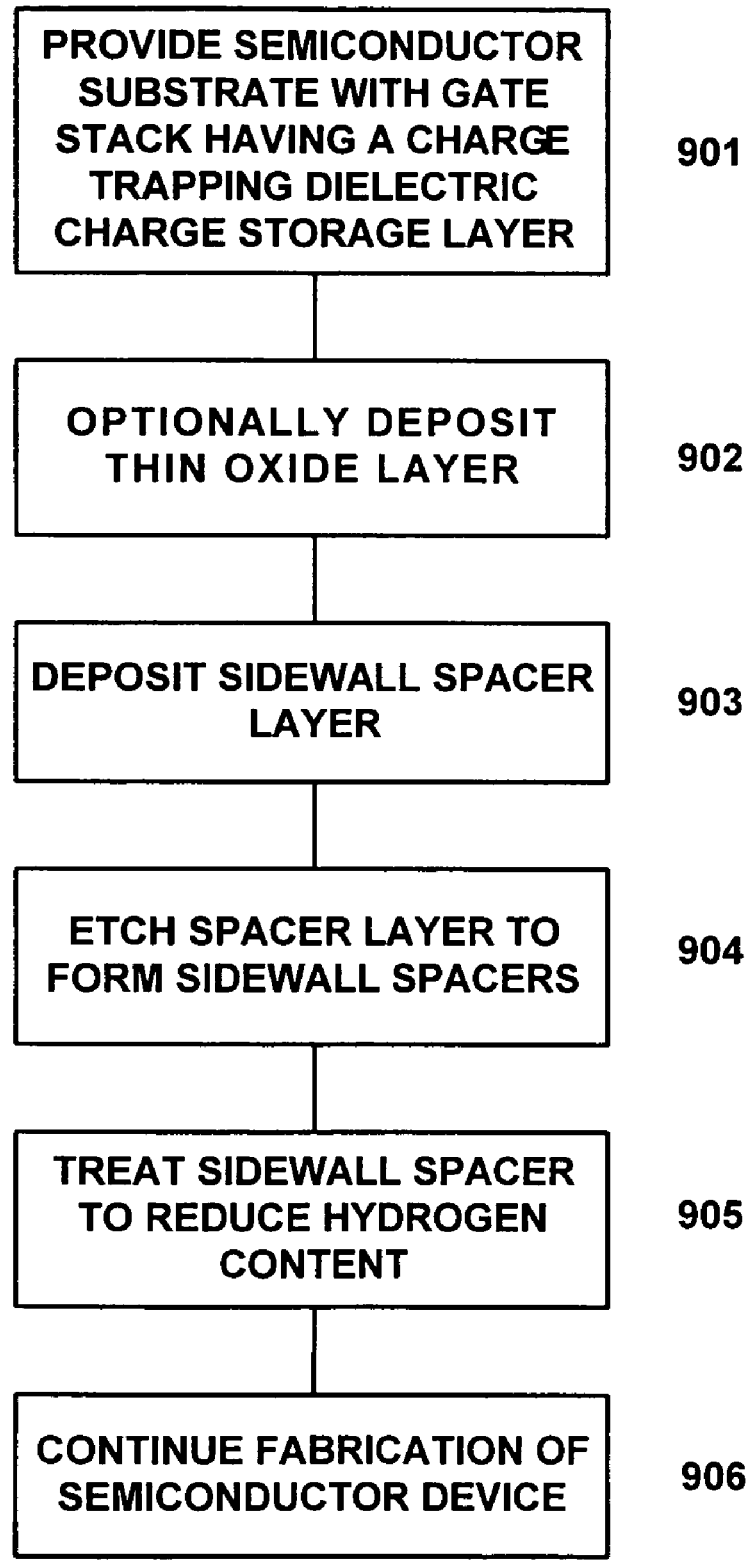
FIG. 9 is a schematic flow diagram generally illustrating steps of fabricating a device in accordance with another embodiment of the present invention.

A description of the present invention follows with reference to FIGS. 2–9. FIGS. 2–7 illustrate, in cross-section, process steps for the fabrication of a gate stack spacer, in accordance with two embodiments of the invention. FIGS. 8 and 9 are schematic flow diagrams generally illustrating steps of processes in accordance with two embodiments of the present invention.

Figure 2:
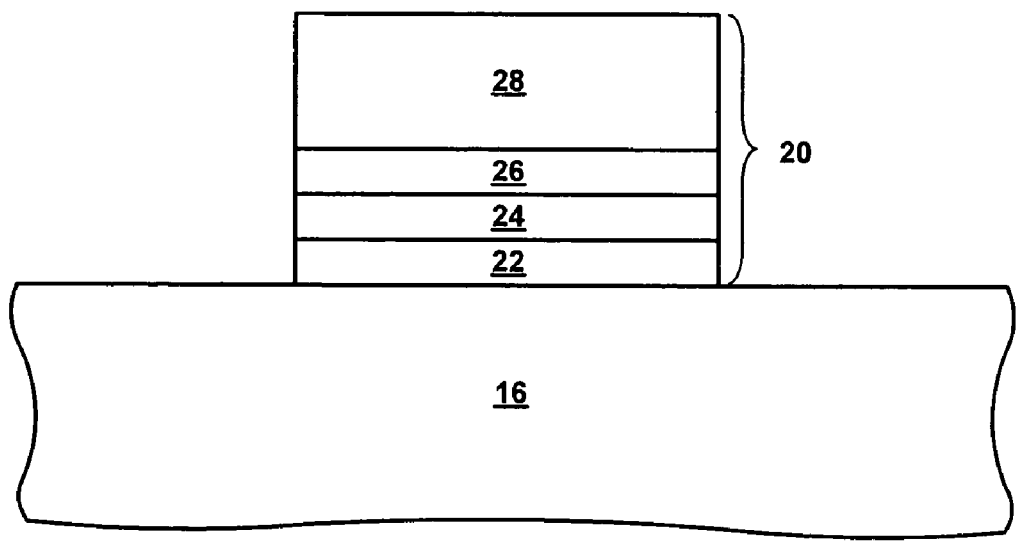

In the first step of the present invention, shown schematically in FIG. 8 as step 801, and in FIG. 9 as step 901, a semiconductor substrate 16 having formed thereon a gate stack 20 is provided, such as is shown in FIG. 2. The semiconductor substrate can be any appropriately selected semiconductor substrate known in the art. For example, the semiconductor substrate can be a bulk silicon substrate, a silicon-on-insulator semiconductor substrate, a p-doped silicon substrate. Suitable semiconductor substrates include, for example, bulk silicon semiconductor substrates, silicon-on-insulator (SOD) semiconductor substrates, germanium-on-insulator (GOI), silicon-on-sapphire (SOS) semiconductor substrates, and semiconductor substrates formed of other materials known in the art. The present invention is not limited to any particular type of semiconductor substrate.

The gate stack 20 includes the bottom oxide layer 22, the charge storage layer 24 and the top oxide layer 26, together forming an ONO structure. The gate stack 20 further comprises the control gate electrode 28, located atop the ONO structure.

In one embodiment, the bottom oxide layer 22 is silicon dioxide. However, the bottom oxide layer 22 is not limited to silicon dioxide. In one embodiment, the bottom oxide layer 22 comprises a high-K dielectric material, a composite dielectric material or, in one embodiment, a dielectric material substantially free of any high-K dielectric material. As used herein, the term "high-K dielectric material" refers to a dielectric material having a K of about 10 or higher. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 10 or higher. In addition, the high-K dielectric materials include, for example, composite dielectric materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate (Ba-$TiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate (Sr-$TiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) $(Ba_{1-x}Sr_xTiO_3)$, PMN (Pb-$Mg_xNb_{1-x}O_3$), PZT $(PbZr_xTi_{1-x}O_3)$, PZN $(PbZn_xNb_{1-x}O_3)$, and PST $(PbSc_xTa_{1-x}O_3)$. In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value of about 10 or higher, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide $(Hf_xZr_{1-x}O_2$, where x ranges between 0 and 1), hafnium silicate $(HfSiO_4)$, hafnium aluminate $(HfAl_2O_5)$ or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

The bottom oxide layer 22 may be formed or deposited by any appropriate method known in the art. For example, the bottom oxide layer 22 can be formed by oxidation of the surface of the semiconductor substrate 16, e.g., by thermal oxidation, ISSG oxidation, steam oxidation or RTO. The bottom oxide layer 22 can also be formed by a deposition process, such as a CVD process. Exemplary CVD processes include, e.g., RTCVD, LPCVD, PECVD, ALD (ALCVD), PLD, MLD or MOCVD. The CVD method may be any appropriate CVD method known in the art. The bottom oxide layer 22 may be deposited by any other known suitable method, such as by a sputter deposition, or other vapor deposition. The present invention is not limited to any particular method for forming the bottom oxide layer 22.

The bottom oxide layer 22 is formed to have a thickness of from about 20 to about 500 angstroms. In one embodiment, the bottom oxide layer 22 has a thickness in a range from about 50 angstroms to about 200 angstroms, and in another embodiment, about 100 angstroms. As will be recognized, the thickness of the bottom oxide layer 22 may vary from these values.

Here and throughout the specification and claims, the limits of the disclosed ranges and ratios may be combined. Thus, for example, it is intended that the foregoing disclosed thickness ranges also include ranges from, e.g., about 20 angstroms to about 200 angstroms, and from about 50 angstroms to about 500 angstroms, although these ranges are not explicitly set forth.

Above the bottom oxide layer 22 is the charge trapping dielectric charge storage layer 24. As noted above, the charge storage layer 24 may comprise silicon nitride or other known charge trapping dielectric materials, such as a suitable high-K dielectric material. Any of the high-K dielectric materials disclosed above with respect to the bottom oxide layer 22 may be used, as appropriate, for the charge storage layer 24. Thus, in one embodiment, the charge storage layer 24 comprises silicon nitride. In another embodiment, the charge storage layer 24 comprises a suitable high-K dielectric material. In another embodiment, the charge storage layer 24 comprises both a high-K dielectric material and a standard-K dielectric material, such as silicon nitride. In one embodiment, the layer 24 comprises a composite dielectric material, which comprises a composite or a reaction product of two or more dielectric materials, one of which is a high-K dielectric material and the other of which may be a standard-K dielectric material such as silicon nitride. The charge storage layer 24 may be deposited by any suitable method such as, for example, the CVD methods mentioned above, or by other suitable method, such as a sputter or other vapor deposition method. The present invention is not limited to any particular method of forming the charge storage layer 24, except in the following embodiment.

In one embodiment, the charge storage layer 24 comprises silicon nitride and is deposited by a conventional method such as any of the methods described above with respect to formation of the bottom oxide layer 22. Thus, in one embodiment, the bottom oxide layer 22 is formed by a CVD process, such as the RTCVD or LPCVD methods described above. In one embodiment, the bottom oxide layer 22 is deposited by another suitable method, such as PECVD, ALD (ALCVD), PLD, MLD or MOCVD. The CVD method may be any appropriate CVD method known in the art.

Above the charge storage layer 24 is a top oxide layer 26. The top oxide layer 26 may comprise any of the materials disclosed above for the bottom oxide layer 22. For example, the top oxide layer 26 may comprise silicon dioxide, a high-K dielectric material or a composite dielectric material, as defined herein.

The top oxide layer 26 may be deposited by any of the methods disclosed above for the bottom oxide layer 22. Thus, in one embodiment, the top oxide layer 26 is formed by an HTO or by a CVD process, such as the RTCVD or LPCVD methods described above. In one embodiment, the top oxide layer 26 is deposited by another suitable method, such as PECVD, ALD (ALCVD), PLD (pulsed layer deposition), MLD (molecular layer deposition) or MOCVD. The CVD method may be any appropriate CVD method known in the art.

In one embodiment, the top oxide layer 26 is formed by ISSG oxidation of a part of the upper surface of the charge storage layer 24, when the charge storage layer material comprises silicon in an oxidizable form, such as silicon nitride. Methods of ISSG oxidation are known in the art.

In one embodiment, in which the deposition of silicon nitride to form the charge storage layer 24 is carried out by RTCVD in the RTP apparatus, at the completion of the deposition, when the cool-down step has reduced the temperature to about 400 to about 500° C., the apparatus is converted for an ISSG oxidation process without removing the wafer from the apparatus, and without exposing the wafer to the outside atmosphere. Thus, these steps in the fabrication of the flash memory device may be carried out sequentially in a single apparatus, without removing the wafer from the apparatus between the charge storage layer 24 formation steps and the top oxide layer 26 formation steps.

Above the layers comprising the ONO structure, a control gate electrode layer 28 is formed on the top oxide layer 26. The gate stack structure 20 shown in FIG. 2 is completed by the layer 28 overlying the top oxide layer 26. The layer forming a control gate electrode 28 may comprise any material known in the art for such use. For example, the control gate electrode layer 28 may comprise polysilicon, polysilicon-germanium, a metal silicide, a metal, or any other suitable material known in the art.

Following formation of the layers 22, 24, 26 and 28 of which the gate stack 20 is comprised, a lithographic patterning and etching process may then be carried out to define the gate stack 20 structure shown in FIG. 2. At this point, a semiconductor substrate 16 having formed thereon a gate stack 20 comprising a charge trapping dielectric charge storage layer 24 and a control gate electrode 28 overlying the charge trapping dielectric charge storage layer 24 has been provided, such as shown in FIG. 2, in accordance with the present invention. At this point, step 801 or 901 is complete, and fabrication of the flash memory device according to the present invention may proceed to step 802 or 902, respectively.

In the next step of the process of the present invention, shown schematically as step 802 in FIG. 8, and as step 902 in FIG. 9, a thin oxide layer 30 is formed over the gate stack 20 and the remainder of the semiconductor substrate not covered by the gate stack 20, such as shown in FIG. 3. The thin oxide layer 30 may be formed by any appropriate process, such as simple oxidation of the surfaces of the substrate 16 and gate stack 20 or deposition of an oxide thereover. The thin oxide layer 30 in one embodiment comprises silicon dioxide. As noted above, in one embodiment, the thin oxide layer 30 may have a thickness from about 20 angstroms to about 300 angstroms. It is noted that formation of the thin oxide layer 30, while conventionally carried out prior to formation of the spacer layer, is optional in the present invention. Thus, steps 802 and 902 are not required steps.

In the next step of the process of the present invention, shown schematically as step 803 in FIG. 8, and as step 903 in FIG. 9, a spacer layer 36 is deposited over the thin oxide layer 30, such as shown in FIGS. 4 and 6. In accordance with the present invention, the spacer layer 36 comprises a first hydrogen content. The first hydrogen content is that obtained by any of several conventional procedures by which the spacer layer 36 is deposited.

In one embodiment, the spacer layer 36 comprises silicon nitride and is deposited by a conventional method such as any of the methods described above with respect to formation of the charge storage layer 24 or the oxide layers 22, 26. Thus, in one embodiment, the spacer layer 36 is formed by an HTO or by a CVD process, such as the RTCVD or LPCVD methods described above. In one embodiment, the spacer layer 36 is deposited by another suitable method, such as PECVD, ALD (ALCVD), PLD, MLD or MOCVD. The CVD method may be any appropriate CVD method known in the art. In other embodiments, the spacer layer 36 may be deposited by any appropriate method known in the art appropriate to deposition of such a layer.

In one embodiment, the spacer layer 36, and thereafter the gate stack spacer 32, may comprise other materials known in the art for use as a gate stack spacer. For example, the gate stack spacer may comprise silicon dioxide, a high-K dielectric material, or a composite dielectric material, such as described above, which may be deposited by any appropriate method, such as those described above. In another embodiment, the spacer layer 36, and thereafter the gate stack spacer 32, may comprise aluminum oxide.

The structure obtained by the step of forming the spacer layer 36 is shown in FIGS. 4 and 6.

Following formation of the spacer layer 36, the following steps of the present invention may take either of two possible courses, represented by two embodiments. A first embodiment is described in steps 804 and 805 of FIG. 8 and is shown schematically in FIGS. 4 and 5. A second embodiment is described in steps 904 and 905 of FIG. 9, and is shown schematically in FIGS. 6 and 7. In the first embodiment, described in steps 804 and 805, the spacer layer 36 is first treated to reduce its hydrogen content, as shown in step 804 and depicted in FIG. 4. Thereafter, the spacer layer 36, with its reduced hydrogen content, is etched to form the gate stack spacers 32, as shown in step 805 and depicted in FIG. 5. In the second embodiment, described in steps 904 and 905, the spacer layer 36, as formed with its first hydrogen content and shown in FIG. 6, is first etched to form the gate stack spacers 36a, as shown in FIG. 7. Thereafter the gate stack spacers 36a are treated to reduce the hydrogen content thereof from the first, as-formed hydrogen content, to the second, reduced, hydrogen content, as shown in step 905. The structure resulting from the second embodiment would be the same as that shown in FIG. 5, from the first embodiment.

In the foregoing embodiments, the methods used for reducing the hydrogen content and for carrying out the etching step are the same in both embodiments, the only difference being in the sequence of these steps. Accordingly, in the following description of the methods for reducing the hydrogen content, the methods will be described with respect to the spacer layer 36 as deposited, prior to the etching step, in accordance with the embodiment shown in FIG. 8, in steps 804 and 805. It will be understood that the same methods apply to the embodiment shown in FIG. 9, in steps 904 and 905, only the sequence of treating to reduce hydrogen content and etching is reversed. For the sake of brevity, the description of these steps will not be repeated with respect to the second embodiment.

FIGS. 4 and 7 schematically illustrate the step of applying a treatment to the spacer layer 36 to reduce the first hydrogen content to a second, lower hydrogen content, by application of one or more of the procedures described in the following, in which the treatment is illustrated schematically by arrows 38. The arrows 38 illustrate, e.g., oxygen atoms or ions being added to the spacer layer 36 by an appropriate method, such as one of the methods described in the following.

In one embodiment, the step of treating the spacer layer 36 (or the gate stack spacer 36a) to reduce the hydrogen content in essence slightly oxidizes, or adds oxygen to, the material of the spacer layer 36, to remove hydrogen by formation of water by the reaction of the applied oxygen with the hydrogen contained in the as-deposited material of the spacer layer 36. Under most conditions of carrying out the step of applying a treatment to reduce the hydrogen content, e.g., a relatively high temperature, any water so formed is rapidly evaporated, thus effectively removing the hydrogen form the spacer layer 36.

In one embodiment, the step of applying a treatment to the spacer layer 36 (or to the gate stack spacer 36a) to reduce its hydrogen content comprises annealing in an atmosphere comprising one or more of oxygen, ozone or nitrous oxide or other highly reactive oxygen-containing materials at a temperature in the range from about 400° C. to about 1100° C. In one embodiment, the annealing is in an atmosphere comprising oxygen, and is carried out at a temperature in the range from about 600° C. to about 1100° C. In another embodiment, the annealing is in an atmosphere comprising ozone, and is carried out at a temperature in the range from about 400° C. to about 600° C. In another embodiment, the annealing is in an atmosphere comprising nitrous oxide, and is carried out at a temperature in the range from about 400° C. to about 600° C.

In one embodiment, the annealing is carried out in a high density plasma comprising one or more of oxygen, ozone or nitrous oxide. In one embodiment, the high density plasma annealing treatment is at a temperature in the range from about 300° C. to about 500° C. In one embodiment, the plasma power is between about 1000 to about 5000 watts. In one embodiment, the chamber pressure is between about 5 and about 100 torr. The plasma anneal may be carried out for a time between about 0.1 and about 5 minutes. The flow rate of oxygen, ozone and/or nitrous oxide may be appropriately selected.

The annealing in one or more of oxygen, ozone or nitrous oxide causes oxygen to enter the spacer layer 36, and forces the reactive oxygen into the spacer layer 36 and to react with hydrogen present therein, thus reducing the hydrogen content from the first to the second hydrogen content.

In one embodiment, the step of applying a treatment to the spacer layer 36 (or to the gate stack spacer 36a) to reduce its hydrogen content comprises (a) a decoupled plasma oxidation, followed optionally by (b) annealing in an atmosphere comprising oxygen and at least one inert gas, such as Ar or $N_2$. Other inert gases may be used, such as He, Ne or Kr. In one embodiment, (a) and (b) are sequentially repeated from two to about five times. In this embodiment, the steps both result in additional oxygen entering the spacer layer 36. These steps cause the oxygen to react with any hydrogen present, after which water thus formed is forced to exit the spacer layer 36 (or gate stack spacer 36a).

The decoupled plasma in (a) differs from a conventional plasma in that in a decoupled plasma, the applied power is separated into a source power, which is a high power supplied to the chamber wall, and a bias power which is connected to the wafer. The source power ionizes the gas supplied into the chamber, and generates the reactive species in the chamber. The bias power on the wafer drives the reactive species towards the substrate and thus controls the rate of reaction. Hence, separation of these power sources provides better control of the process, as compared to conventional plasma which uses a single power source to create the plasma and to drive the generated species into the target.

Those skilled in the art will realize that power settings, residence times, gas flow rates are equipment-specific and will vary from one brand of plasma equipment to another. In general, the gas mixture employed includes oxygen in some reactive form such as $O_2$, $O_3$ or $N_2O$, and may also include argon. The oxygen flow ranges from about 5 standard cubic centimeters per minute (sccm) to about 500 sccm, and in one embodiment, about 250 sccm. In an embodiment including argon, the argon flow may range from about 20 sccm to about 300 sccm, and in one embodiment, about 50 sccm. In one embodiment, the gas pressure in the chamber ranges from about 5 millitorr (mT) to about 100 mT, and in one embodiment, about 20 mT. The decoupled plasma equipment parameters include a source power of about 400 W to about 2000 W, and in one embodiment, about 1400 W, and a bias power of about 50 W to about 500 W, and in one embodiment, about 200 W. The decoupled plasma may be applied to the spacer layer 36 for a period from about 1 seconds to about 100 seconds, and in one embodiment, for about 5 to about 10 seconds.

In one embodiment, following application of (a) the decoupled plasma, the spacer layer 36 is (b) annealed in an atmosphere comprising oxygen and at least one inert gas, such as Ar or $N_2$, at a temperature in the range from about 600° C. to about 1100° C., and in one embodiment from about 700° C. to about 850° C., for a period ranging from about 1 second to about 2 minutes, and in one embodiment, for a period ranging from about 5 seconds to about 60 seconds. In one embodiment, the ratio of oxygen to the at least one inert gas ranges from about 1:20 to about 1:1, and in another embodiment, the ratio ranges from about 1:10 to about 1:2, and in another, the ratio ranges from about 1:7 to about 1:5. The annealing step (b) drives the oxygen into the spacer layer 36, to provide better access to any hydrogen in the layer.

As indicated, the annealing step (b) is optional and may be omitted. For example, in the second embodiment in which the previously etched gate stack spacer 36a is being treated, the annealing step may be omitted in some embodiments, since the size and thickness of the gate stack spacer 36a are less than those of the spacer layer 36.

In one embodiment, the step of applying a treatment to the spacer layer 36 (or the gate stack spacer 36a) to reduce its hydrogen content comprises carrying out a rapid thermal oxidation (RTO) of the spacer layer 36 at a temperature of about 700° C. to about 1100° C. in an oxidizing atmosphere. In one embodiment, the spacer layer 36 may be treated by RTO at an elevated temperature in the presence of dry molecular oxygen. In one embodiment, the RTO is carried out at a temperature in the range of about 850° C. to about 1050° C., and in one embodiment, from about 900° C. to about 1000° C. The RTO process may be carried out in either a batch-type thermal oxidation furnace, or alternatively, in a single-wafer oxidation apparatus. In one embodiment, the RTO is carried out in the same RTP apparatus as that in which the other steps of the present process are carried out. In one embodiment, the RTP apparatus is part of a single-wafer cluster tool. In one embodiment, the oxygen content in the apparatus may range from about 1 to about 20 volume percent, and in another embodiment, the oxygen content may range from about 1 to about 100 volume percent.

In one embodiment, the RTO is conducted in an atmosphere comprising oxygen and from about 2 to about 15 volume percent ozone at a temperature of at least about 750° C., up to about 1100° C., and in one embodiment between about 850° C. to about 1000° C. In one embodiment, the oxygen stream contains from about 3 to about 8 volume percent ozone, in another embodiment, from about 4 to about 7 volume percent ozone, and in another embodiment, from about 5 to about 6 volume percent ozone. The atmosphere in the RTO chamber may also contain small amounts of one or more other materials known in the art to enhance the rate of silicon oxidation. Such materials include, for example, chlorine (e.g., HCl, $Cl_2$, etc.), water, etc. If employed, such materials are generally employed in their conventional amounts (e.g., when HCl is employed, it is generally employed up to about 2.5 volume percent HCl).

In one embodiment, in the RTO, the spacer layer 36 is held in the chamber at the selected temperature for a period ranging from about 1 second to about 100 seconds. As will be understood, the time varies depending on the temperature, the gases used, the nature and thickness of the spacer layer 36, and other factors known to those of skill in the art. For example, higher temperatures and higher contents of ozone and/or other oxidation enhancing agents generally require shorter times.

In one embodiment, the step of applying a treatment to the spacer layer 36 (or to the gate stack spacer 36a) to reduce its hydrogen content comprises applying free radical oxidation conditions to the spacer layer 36. Suitable free radical oxidation conditions may include any such conditions known in the art, for example, by exposing the spacer layer 36 to an oxygen plasma, in which oxygen free radicals are generated. The oxygen free radicals can penetrate into the spacer layer 36 to react with any hydrogen encountered. As a result of the reaction, water may be formed, and thence evaporated from the spacer layer 36, thereby effectively removing hydrogen and reducing the hydrogen content of the spacer layer 36 from the first to the second, lower hydrogen content.

In one embodiment, the step of applying a treatment to the spacer layer 36 to reduce its hydrogen content comprises exposing the spacer layer 36 (or the gate stack spacers 36a) to in-situ steam generation (ISSG) oxidation. In one embodiment, the treatment by ISSG oxidation is carried out by placing the spacer layer 36 in an RTP chamber and flowing a mixture of oxygen-containing gas and hydrogen-containing gas to the chamber at suitable flow rates and pressure. The temperature of the RTP chamber can be in the range from about 700° C. to about 1150° C. The flow rates and temperature may be suitably selected to provide rapid oxidation of hydrogen in the spacer layer 36. In one embodiment, in order to avoid excess oxidation of the spacer layer 36, the quantity of steam generated in the reaction chamber is reduced by introduction of an inert gas, such as argon.

For the ISSG process described above, any of the commercially available RTP systems can be utilized.

In one embodiment, the hydrogen-containing gas is hydrogen gas, $H_2$. In another embodiment, the hydrogen-containing gas is methane, $CH_4$. In one embodiment, methane is disfavored due to the possible incorporation of carbon into the spacer layer 36.

In one embodiment, the oxygen-containing gas is oxygen gas, $O_2$. In another embodiment, the oxygen-containing gas is nitrous oxide, $N_2O$.

When the hydrogen-containing gas is hydrogen and the oxygen containing gas is oxygen, in one embodiment, the ratio of hydrogen to oxygen is about 2:1, i.e., a substantially stoichiometric ratio. In one embodiment, an increased amount of oxygen is provided, in order to more rapidly drive the ISSG oxidation to completion. Thus, in one embodiment, the ratio of oxygen to hydrogen is in the range from greater than about 2:1 to about 5:1. In another embodiment, the ratio of oxygen to hydrogen is in the range from greater than about 2:1 to about 3:1. In one embodiment, the ratio of oxygen to hydrogen is maintained at a super-stoichiometric ratio, in order to avoid or minimize the presence of free hydrogen, which could reverse the desired reaction which is intended to remove hydrogen from the spacer layer 36.

In one embodiment, the absolute pressure in the RTP chamber is in the range from about 50 Torr to about 500 Torr. In another embodiment, the absolute pressure in the RTP chamber is in the range from about 100 Torr to about 300 Torr, and in another embodiment, from about 100 Torr to about 200 Torr, and in another, at about 150 Torr.

In one embodiment, the ISSG reaction is carried out so that the hydrogen-oxygen reaction takes place substantially at the surface of the spacer layer 36, by heating only the surface of the wafer. In one embodiment, a portion of the oxygen provided may react with hydrogen from the spacer layer 36. Formation of the in-situ generated steam at the surface of the spacer layer 36 allows greater control over the ISSG oxidation than is available with either other forms of steam oxidation or other oxidations, such as dry oxygen oxidation, or fluorine-enhanced oxidation.

The ISSG oxidation of the spacer layer 36 may continue for a period in the range from about 1 second to about 100 seconds. In one embodiment, the ISSG oxidation of the spacer layer 36 continues for a period from about 2 to about 10 seconds.

In one embodiment, the step of applying a treatment to reduce the hydrogen content of the spacer layer 36 comprises applying steam oxidation conditions to the layer. The steam oxidation is carried out for a brief period by methods known in the art. Thus, for example, the spacer layer 36 is exposed to a steam-containing (or water vapor-containing) atmosphere at a temperature ranging from about 400° C. to about 1100° C., for a period ranging from about 0.1 minute to about 5 minutes. In another embodiment, the steam oxidation maybe carried out at a temperature in the range from about 400° C. to about 900° C., and in another embodiment, the steam oxidation maybe carried out at a temperature in the range from about 800° C. to about 1100° C., each for an appropriate time. The exposure time should be short enough that a substantial portion of the spacer layer 36 is not degraded by the steam, but long enough to cause reaction with and removal of at least a portion of the hydrogen in the spacer layer 36.

In the foregoing methods of carrying out the step 804 or 905, in which a treatment is applied to reduce the hydrogen content, the conditions and times should be adjusted to avoid excessive oxidation of the spacer material, while at the same time being sufficient to reduce the hydrogen content from the first hydrogen content to the second, lower hydrogen content. As will be understood by a person of ordinary skill in the art, some experimentation may be needed to adjust the conditions and times needed to obtain the desired hydrogen content reduction, depending on the nature of the spacer material and the method selected for use in reducing the hydrogen content.

As a result of the foregoing step 804, or 905, in which one of the foregoing treatments has been applied to the spacer layer 36, or in the latter embodiment, the gate stack spacer 36a, the hydrogen content is reduced from the first, as-formed hydrogen content, so a second, lower hydrogen content.

The second, lower hydrogen content of the spacer layer 36, or of the gate stack spacer 36a after such treatment, as used herein, means that the hydrogen content of the spacer material is less than the hydrogen content of a conventional gate stack spacer material, i.e., as the gate stack material was deposited by conventional methods. In one embodiment, the spacer material according to the present invention comprises a hydrogen content of about 2 atomic percent or less, while the hydrogen content of a conventional gate stack spacer material is substantially greater than 2 atomic percent. In some conventional spacer materials, the hydrogen content may range from about 3 atomic percent hydrogen to about 30 atomic percent, and in other materials, from about 5 atomic percent hydrogen to about 20 atomic percent, and in others from about 5 atomic percent to about 10 atomic percent hydrogen.

In accordance with the present invention, the spacer layer 36, or the spacer 32, after treatment to reduce the hydrogen content, comprises hydrogen at about 2 atomic percent or less, and in one embodiment, comprises hydrogen at about 1 atomic percent or less, or in another embodiment, comprises hydrogen at about 0.5 atomic percent or less. In one embodiment, the spacer material comprises a hydrogen content less than about 0.1 atomic percent. In one embodiment, the hydrogen content is in the range from about 0.1 atomic percent to about 0.5 atomic percent. In one embodiment, hydrogen is substantially not detectable in the spacer material in the spacer layer 36, when measured by, for example, FTIR.

Hydrogen content may be determined by, for example, FTIR (Fourier Transform IR), SIMS (Secondary Ion Mass Spectroscopy) or RBS (Rutherford Backscattering Spectroscopy). At present the lower limit of detection of hydrogen by FTIR is about 0.05 atomic percent. In one embodiment, the hydrogen content of the spacer layer 36 after treatment, and/or of the gate stack spacer 32, can be determined by use of FTIR (Fourier transform infrared spectroscopy). With currently available FTIR, levels of hydrogen lower than about 0.05 atomic percent are difficult to measure. Thus, when the hydrogen content of the spacer layer 36 and/or of the gate stack spacer 32 is low enough that it cannot be detected by FTIR, it may be considered to be substantially zero hydrogen content.

In one embodiment, hydrogen substantially does not migrate from the gate stack spacer 32 or the spacer layer 36 having a reduced hydrogen content into the gate stack 20 during subsequent processing or in use. Thus, in this embodiment, whatever the absolute hydrogen content, the hydrogen content of the spacer layer 36 is reduced to a level such that substantially no hydrogen migrates from the spacer layer 36 or from the gate stack spacer 32 during subsequent processing in the fabrication of the device, or during subsequent use of the device by an end user. "Substantially no hydrogen migrates" means that no, or very little, if any, hydrogen migrates, and any hydrogen that does migrate is either not detectable or has no adverse effect on operation of the flash memory device.

At an appropriate point in the process of the present invention, the spacer layer 36 is etched to form the gate stack spacers 36a or 32. Which of the gate stack spacers 36a or 32 is formed by the etching depends on when the etching step is carried out. In a first embodiment, illustrated in FIG. 8 and in FIGS. 4 and 5, following deposition of the spacer layer 36, the step of applying a treatment to reduce the hydrogen content is carried out, as shown in FIG. 4, and then the spacer layer 36 is anisotropically etched to form the gate stack spacers 32, as shown in FIG. 5. In a second embodiment, illustrated in FIG. 9 and in FIGS. 6 and 7, following deposition of the spacer layer 36, in the next step the spacer layer 36 shown in FIG. 6 is anisotropically etched to remove the spacer material from the horizontal surfaces, but to leave the gate stack spacers 36a on the vertical (or substantially vertical, depending on the etch process) sides of the gate stack 20, as shown in FIG. 7. Thereafter, the gate stack spacers 36a are treated to reduce the hydrogen content in accordance with the invention to form the gate stack spacers 32.

In the etching step, any known, conventional etching processes may be used, with the proviso that the methods be carried out in a manner which does not result in addition of hydrogen to the remaining gate stack spacers 32. In one exemplary embodiment, reactive ion etching is used for the etching step. In another exemplary embodiment, a dry plasma etch technique is used for the etching step.

Upon completion of step 805, as shown in FIG. 8, or of step 905, shown in FIG. 9, fabrication of the semiconductor device continues, as shown in step 806 of FIG. 8 and FIG. 906 of FIG. 9.

There has been disclosed in accordance with the invention a process for fabricating a charge trapping dielectric charge storage flash memory device, for example for use in a MIRRORBIT™ device, that fully provides the advantages set forth above. Although described in terms of, and particularly applicable to, charge trapping dielectric charge storage flash memory devices, the present invention is broadly applicable to fabrication of any semiconductor device including a structure in which hydrogen content needs to be reduced to avoid migration of hydrogen to other parts of the device which may be sensitive to the presence of hydrogen.

INDUSTRIAL APPLICABILITY

The present invention provides a solution to various problems resulting from the presence of hydrogen in materials such as silicon nitride of which a spacer for a semiconductor device is formed. Thus, the present invention helps to eliminate or reduce problems resulting from hydrogen in structures such as a gate stack spacer structure used in a flash memory device such as a charge trapping dielectric flash memory device.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the gate stack structure, the thin oxide layer and the gate stack spacers can be varied from that described herein. Furthermore, as noted, the invention is broadly applicable to any semiconductor device including a dielectric layer which may contain hydrogen in amounts which can interfere with operation of the device if not removed. It is therefore intended to include within the invention all such variations and modifications that fall within the scope of the appended claims and equivalents thereof.

What is claimed is:

1. A process for fabricating a semiconductor device comprising:

providing a semiconductor substrate having formed thereon a semiconductor device;

depositing over the semiconductor device a spacer layer, the spacer layer having a first hydrogen content; and applying a treatment to reduce the first hydrogen content to a second hydrogen content;

wherein the treatment comprises one or more of RTO oxidation of at least a portion of the spacer layer in an oxidizing atmosphere, ISSG oxidation of at least a portion of the spacer layer, free radical oxidation of at least a portion of the spacer layer, decoupled plasma oxidation of at least a portion of the spacer layer, and steam oxidation of at least a portion of the spacer layer at a temperature in the range from about 400° C. to about 1100° C.

2. The process of claim 1, wherein the first hydrogen content is in a range from greater than about 2 atomic percent to about 30 atomic percent.

3. The process of claim 1, wherein the second hydrogen content is less than about two atomic percent.

4. The process of claim 3, wherein the second hydrogen is in the range from about 0.1 atomic percent to about 0.5 atomic percent.

5. The process of claim 3, wherein the second hydrogen content is substantially zero or not detectable by FTIR.

6. The process of claim 1, wherein hydrogen substantially does not migrate into the semiconductor device from the spacer layer during subsequent processing or in use.

7. The process of claim 1, wherein the treatment is applied to the spacer layer, prior to etching to form a spacer for the semiconductor device.

8. The process of claim 1, wherein the process further comprises a step of etching to form a spacer for the semiconductor device, and the treatment is applied to the spacer subsequent to the etching step.

9. The process of claim 1, wherein the treatment is applied to the gate stack spacer subsequent to an etching step for forming a gate stack spacer.

10. A process for fabricating a charge trapping dielectric flash memory device comprising:
   providing a semiconductor substrate having formed thereon a gate stack comprising a charge trapping dielectric charge storage layer and a control gate electrode overlying the charge trapping dielectric charge storage layer;
   depositing over the gate stack a spacer layer, the spacer layer having a first hydrogen content; and
   applying a treatment to reduce the first hydrogen content of at least a portion of the spacer layer to a second hydrogen content.

11. The process of claim 10, wherein the treatment comprises one or more of RTO oxidation of at least a portion of the spacer layer in an oxidizing atmosphere, ISSG oxidation of at least a portion of the spacer layer, free radical oxidation of at least a portion of the spacer layer, decoupled plasma oxidation of at least a portion of the spacer layer, and steam oxidation of at least a portion of the spacer layer at a temperature in the range from about 400° C. to about 1100° C.

12. The process of claim 10, wherein the first hydrogen content is in a range from greater than about 2 atomic percent to about 30 atomic percent.

13. The process of claim 10, wherein the second hydrogen content is less than about two atomic percent.

14. The process of claim 13, wherein the second hydrogen is in the range from about 0.1 atomic percent to about 0.5 atomic percent.

15. The process of claim 13, wherein the second hydrogen content is substantially zero or not detectable by FTIR.

16. The process of claim 10, wherein hydrogen substantially does not migrate into the gate stack from the spacer layer during subsequent processing or in use.

17. The process of claim 10, wherein the treatment is applied to the spacer layer, prior to an etching step for forming a gate stack spacer.

18. A charge trapping dielectric flash memory device comprising:
   a semiconductor substrate having formed thereon a gate stack comprising a charge trapping dielectric charge storage layer and a control gate electrode overlying the charge trapping dielectric charge storage layer; and
   a gate stack spacer adjacent sides of the gate stack,
   wherein the gate stack spacer comprises a hydrogen content less than about two atomic percent.

19. The device of claim 18, wherein the hydrogen content is in the range from about 0–1 atomic percent to about 0.5 atomic percent.

20. The device of claim 18, wherein the hydrogen content is substantially zero or not detectable by FTIR.

* * * * *

UNITED STATES PATENT AND TRADEMARK OFFICE
CERTIFICATE OF CORRECTION

PATENT NO. : 6,949,481 B1
DATED : September 27, 2005
INVENTOR(S) : Halliyal et al.

It is certified that error appears in the above-identified patent and that said Letters Patent is hereby corrected as shown below:

Column 6,
Line 29, replace "insulator (SOD) semiconductor" with -- insulator (SOI) semiconductor --.

Column 18,
Line 33, replace "about 0-1 atomic" with -- about 0.1 atomic --.

Signed and Sealed this

Twenty-second Day of November, 2005

JON W. DUDAS
*Director of the United States Patent and Trademark Office*